United States Patent
Mueller et al.

(10) Patent No.: US 6,526,384 B1
(45) Date of Patent: Feb. 25, 2003

(54) METHOD AND DEVICE FOR LIMITING A STREAM OF AUDIO DATA WITH A SCALEABLE BIT RATE

(75) Inventors: Joerg-Martin Mueller, Schwaikheim (DE); Bertram Waechter, Allmersbach im Tal (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/509,842

(22) PCT Filed: Sep. 29, 1998

(86) PCT No.: PCT/DE98/02877

§ 371 (c)(1),
(2), (4) Date: Jun. 26, 2000

(87) PCT Pub. No.: WO99/18673

PCT Pub. Date: Apr. 15, 1999

(30) Foreign Application Priority Data

Oct. 2, 1997 (DE) .......................... 197 43 622

(51) Int. Cl.⁷ .............................................. G10L 19/02
(52) U.S. Cl. ...................... 704/501; 704/203; 704/205
(58) Field of Search ................................. 704/500–504, 704/229–230, 200–206

(56) References Cited

U.S. PATENT DOCUMENTS

| | | |
|---|---|---|
| 4,853,779 A | 8/1989 | Hammer .................. 375/240.22 |
| 6,446,037 B1 * | 9/2002 | Fielder et al. ............... 704/229 |
| 6,449,596 B1 * | 9/2002 | Ejima ......................... 704/501 |

FOREIGN PATENT DOCUMENTS

| | | | |
|---|---|---|---|
| WO | 93 23956 A | 11/1993 | .......... H04N/7/137 |
| WO | 97 15983 | 5/1997 | ............ H04B/1/66 |

OTHER PUBLICATIONS

Brandenburg K et al: "First Ideas On Scalable AUDUI Coding", American Engineering Society Convention, Nov. 10, 1994, pp. 1–6.
Grill B. et al: "A Two–Or Three=Stage Bit Rate Scalable Audio Coding System", American Engineering Society Convention, Oct. 6, 1995, pp. 1–8.
Kudumankis P., et al: "Wavelet Packet Based Scalable Audio Coding", 1996 IEEE International Symposium on Circuits and Systems . . . , May 12–15 1996, pp. 41–44.

* cited by examiner

*Primary Examiner*—David D. Knepper
(74) *Attorney, Agent, or Firm*—Michael J. Striker

(57) ABSTRACT

Generating a bit rate scalable audio data stream is applicable in the field of data communications, and is based on the problem of providing a process and a device which can be used in a versatile manner and which have a high degree of flexibility with respect to the available transfer rates. This problem is solved by a process for generating a bit rate scalable audio data stream having the following steps: compression of the audio data stream in a core codec (100) accompanied by determination of core parameters (102); and enhancement of the coding in at least one downstream enhancement stage (110), characterized in that the enhancement in the enhancement stage (110) is controlled by the core parameters (102).

11 Claims, 3 Drawing Sheets

METHOD AND DEVICE FOR LIMITING A STREAM OF AUDIO DATA WITH A SCALEABLE BIT RATE

BACKGROUND OF THE INVENTION

The invention is directed to a process and a device for generating a bit rate scalable audio data stream. The invention is applicable in the field of data communications, particularly in the field of audio data communications.

A known problem in the field of data communications consists in that the data signal to be transferred is present in a data source with a high data rate, for example, at 64 kbit per second, but the data channel available for transfer or processing can only transfer the data to be transferred at a lower data rate, for example, at 32 kbit per second. In this case, the data must first be decoded at the higher data rate and then coded again at the lower data rate. This brings about a high expenditure on hardware technology and computing, especially because the data rate in modern data networks is not constant but variable and is adapted to the particular load situation of the data network. Compared to this, it would be more beneficial if a bit rate scalable data stream were to be supplied, of which only a part of the available data bits is transferred depending on the data rate offered by the transfer channel. Corresponding processes for generating bit rate scalable audio data streams are being undertaken across the world at the present time, in particular within the framework of efforts made towards standardization, for example, within the framework of the MPEG 4 (Moving Picture Expert Group) standardization. In particular, the CODECs (COder/DECoder) developed within the framework of the MPEG4 standardization must guarantee the functionality of the bit rate scalability.

A process for the generation of a bit rate scalable audio data stream in which the audio data stream is compressed in a core codec accompanied by determination of parameters is known from WO 97 159 83A. The coding is enhanced in subsequent enhancement stages. The enhancement stages are controlled in dependence on the core parameters.

The invention is therefore based on the problem of providing a process and a device for generating a bit rate scalable audio data stream which can be used in a versatile manner, which ensure a good transfer quality even when the available transfer rate is low, and which achieve a high degree of flexibility with respect to the available transfer rate in an economical manner.

In accordance with the present invention a process for generating a bit ratio scalable audio data stream includes: compression of the audio data stream in a core codec accompanied by the determination of core parameters; and enhancement of the coding in at least one downstream enhancement stage, wherein the enhancement in the enhancement stage is controlled by the core parameters, wherein the audio data stream is frequency-transformed, wherein a synthesized audio signal produced by the core codec is likewise frequency-transformed, and wherein the frequency-transformed synthesized audio signal is combined with the frequency-transformed audio data stream.

For a process for generating a bit rate scalable audio data stream with the step of compression of the audio input data stream in a core codec accompanied by determination of core parameters and the step of enhancement of the coding in at least one downstream enhancement stage, the problem is solved in that the enhancement in the enhancement stage is controlled by means of the core parameters. For the process according to the invention, the core codec forms the core assembly and codes the arriving input data stream at a low bit rate of, for example, 2, 4 or 6 kbit per second. The core codec is followed by any number of improvement or enhancement stages, as they are called, which code at a data rate of 1, 2, 3 or 4 kbit per second depending on application. An advantage of this process consists in that omission of any one enhancement stage has no effect on the other parts of the bit stream. It is an essential condition that the provided transfer system guarantees at least the bit rate of the core codec. The core codec parameterizes the incoming audio signal and determines, for example, parameters like pitch, voiced/unvoiced sounds, or the volume of sound. A core codec according to ITU-T G.723.1 (ITU, International Telecommunication Union), for example, can be used. It is particularly advantageous in the process according to the invention that the core parameters determined by the core codec control the subsequent enhancement stages because a considerable increase in the efficiency of the enhancement stages is achieved in this way.

In a particular embodiment type of the invention, the process is characterized in that a vector coding is effected in the enhancement stage and in that the core parameters control the selection of code books. This is advantageous because the code books for vector coding used in periodic audio segments are different from those used in non-periodic audio segments. Also, the energy parameters of the core codec are used directly for the coding of the signal energy (volume of sound), which results in a considerable bit rate saving. The use of core parameters is possible because they have to be transferred to the receiver in any case.

In a particular embodiment form, the process is characterized by the steps of transforming the audio input data stream, transforming a synthesized audio signal generated by the core codec, and a combination of the transformed synthesized audio signal with the transformed audio data stream. In this way, the difference between the audio signal compressed by the core codec and the original signal is determined advantageously in an economical manner and with high precision. In the simplest case, the combination can be a subtraction; however, more complex operations such as adapting the core spectrum for better matching with the original spectrum can also be involved. In this latter particular embodiment of the invention, the combination parameters for the adaptation must be transferred to the receiver.

In a particular embodiment of the invention, the process is characterized in that the core codec divides the input signal into at least two subframes; in that the transformation is a frequency transformation running synchronous to the subframe of the core codec; in that, by means of the frequency transformation, a transformation is effected per subframe which generates a spectrum vector in each instance; in that each spectrum vector is divided into at least two partial vectors corresponding to two partial bands; and in that each enhancement stage enhances one of these partial bands. The utilized frequency transformation and the dividing into partial bands has the advantage that the process according to the invention not only enables a high efficiency for the bit rate scaling according to objective criteria, but also takes into consideration subjective criteria such as the acoustic and physiological boundary conditions of human hearing. A resource allocation unit determines which partial band is to be enhanced. As has already been mentioned, this determination can be effected using a psycho-acoustic model which determines which frequency bands are subjectively important, or by measurements of signal-to-noise ratios, for example.

In a particular embodiment type of the invention, the process is characterized in that, for each enhancement stage, one set of parameters and one address for the enhanced partial band are transferred. Since the allocation unit enhances the partial bands in the order of their importance, this embodiment of the invention has the advantage that the enhanced bits are stored in the bit stream in the order of their importance. Since every stage has been provided with an address, allocation can be effected in the receiver without problems and in a manner that is reliably correct. Scaling is now made possible without problems and without any additional expenditure merely by suppressing a corresponding number of enhancement stages, beginning with the last, least significant stage. It is further advantageous that this scaling can be effected at any point on the transfer line. An additional modification of the remaining bit stream is not necessary for this.

In a particular embodiment of the invention, the process is characterized by storing for every partial band as many enhancement stages, arranged one behind the other in a bit stream to be transferred, as are present for the respective partial band; storing additional information for the determination of the relative importance of the individual enhancement stages of the partial bands; and bringing together the bit stream and the additional information before transfer in a bit stream manipulation unit. In so doing, it is advantageous that the overhead generated is lower compared with the above-mentioned storage and transfer formatting due to the fact that addressing of the separate enhancement stages is no longer necessary. This advantage is particularly relevant for database access.

In another particular embodiment of the invention, the process is characterized by the generation of partial bands on the receiver side by calculation from neighboring partial bands that have been received, in particular by interpolation. Other mathematical methods aside from interpolation can be taken into consideration, for example, statistical methods under consideration of the characteristics of the transferred data stream. The advantage therein consists in that partial bands which do not reach the receiver in time, or at all, because of faulty transfer or interrupted transfer can be reconstructed, or that partial bands can even be calculated in advance when individual partial bands or data packets are delayed along the transfer route.

The teaching of the invention also includes a device for generating a bit rate scalable audio data stream with a core codec which compresses the audio input data stream while also determining core parameters, and at least one enhancement stage downstream of the core codec, characterized in that the core codec is connected with the enhancement stage and the core parameters control the enhancement stage. Such a device is covered by the teaching of the present invention particularly when it carries out one of the processes described above, in particular when it carries out a process in which the device has an allocation control which controls which partial band is enhanced. The advantages indicated above within the framework of the description of the process according to the invention apply in a corresponding manner to the device according to the invention.

The teaching of the invention also covers the use of core parameters of a core codec for controlling the enhancement of the coding in an enhancement stage. This has the particular advantage that the core parameters which have been determined and transferred by the core codec and which represent the parameterization of the input signal can be used effectively for controlling the enhancement stages and, in particular, distinctly improve the subjective transfer quality in particular from a first enhancement stage on.

The teaching of the invention also covers a data carrier on which control information has been stored, characterized in that the control information controls the flow of one of the processes described above in an electronic computing device or in one of the devices described above. The data carrier can store the control information in any form, in particular in mechanical, optical, magnetic or electronic form. It is particularly advantageous that the control information stored in this manner is portable, can be implemented easily, is inexpensively reproducible and can be maintained with little expenditure. Implementing the control information in an electronic computing installation is possible by using prior art measures.

Further advantages, features and details of the invention are indicated in the subclaims and in the subsequent description in which a plurality of embodiment examples are described in detail with reference to the drawings. In this case, the features mentioned in the claims and in the description can be essential for the invention by themselves or in any combination. A mode for carrying out the claimed invention is subsequently discussed in detail with reference to the drawings.

BRIEF DESCRIPTION OF THE DRAWINGS

FIG. 4b shows a bit manipulation unit according to the alternative storage and transfer format of FIG. 4a.

DESCRIPTION OF PREFERRED EMBODIMENTS

Figure 1:
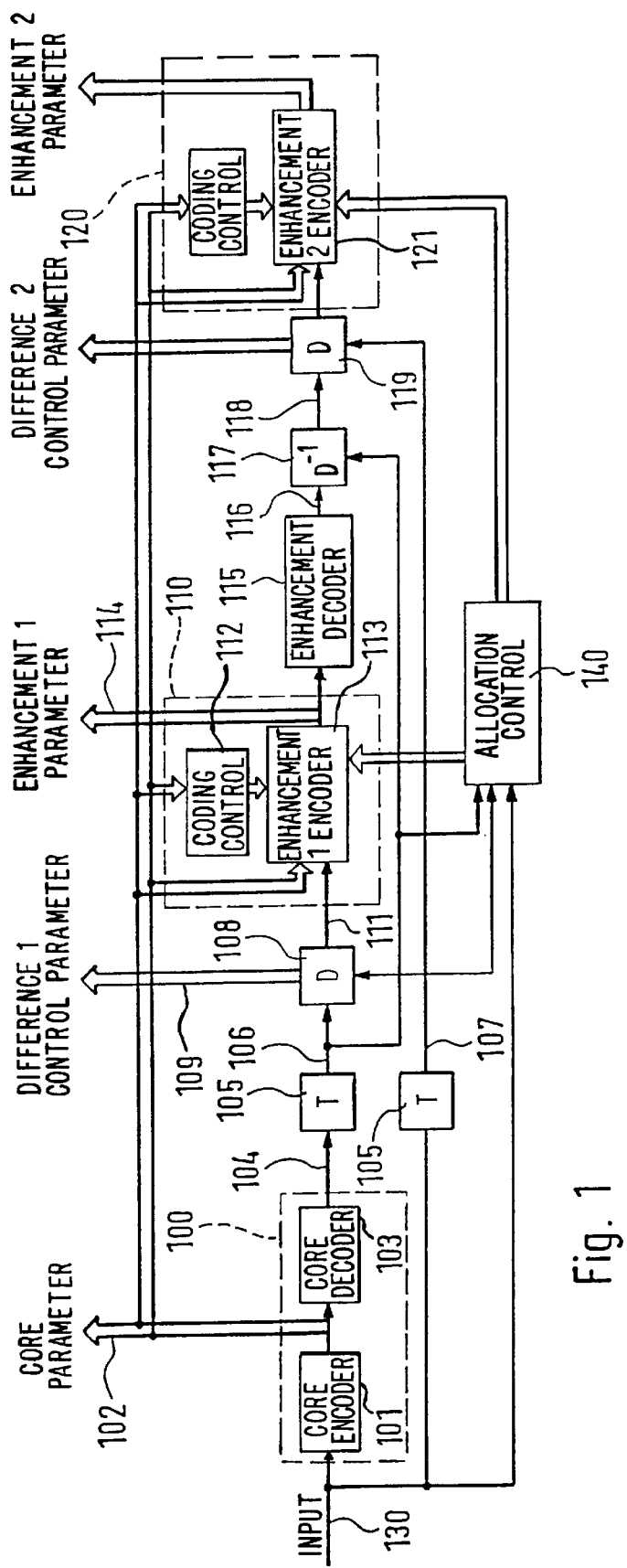
FIG. 1 shows the device according to the invention with a core codec and two enhancement stages.

FIG. 1 shows a device according to the invention with a core codec 100 and two enhancement stages 110, 120. First, the input signal 130 is compressed by the core coder 101. This core coder 101 can represent any algorithm and can work at any sampling rate. In a preferred embodiment form, a standardized codec, e.g., an ITU-T codec, is used. The bit stream generated by the core coder 101, namely, the core parameters 102, is stored. After this, the decoding is effected by means of the core decoder 103 and using the core algorithm. The synthesized audio signal 104 generated by the core decoder 103 is subjected to a mathematical operation 105, as is the original input signal 130. This mathematical operation 105 can be, for example, a fast Fourier transform (FFT), a MDCT (Modified Discrete Cosine Transformation) or a QMF filterbank. By means of this transform 105, a transformed synthesized audio signal 106 results from the synthesized audio signal 104. By means of the same transform 105, a transformed input signal 107 results from the input signal 130. The input signal 130, the transformed input signal 107 and the transformed, synthesized audio signal 106 are supplied to an allocation control 140. Moreover, the two signals 106, 107 are combined in an operation 108. In the simplest case, this operation 108 can be generation of a difference (subtraction), but it can also contain more complex operations such as an adaptation of the core spectrum for a better match with the original spectrum, in which case the adaptation or control parameter must also be transferred 109.

Subsequently, the combination signal 111 is supplied to an improvement or enhancement stage 110. This enhancement stage 110 now codes the applied signal 111. A variety of processes of audio coding can be used as coding algorithms; the use of vector quantization or vector coding is preferred. The results or parameters 102 of the core codec 100 are used for the control and configuration 112 of this coding section 113 of the first enhancement stage 110. The efficiency of the enhancement stage 110 is substantially improved by this step. The use of the core parameters 102 is possible because they have to be transferred to the receiver in any case. For the represented case, these core parameters 102 control a code book selection. In periodic audio segments, the code books that are used are different from those used in non-periodic audio segments. Further, the energy parameters of the core codec 100 are used directly for the coding of the signal energy (volume of sound), which leads to a bit rate saving. The code books have been trained and optimized in particular and are selected depending on which speech or language segment the audio signal is in at the moment, for example, whether a voiced or an unvoiced sequence of sounds is present. The incoming received data can be interpreted on the receiver end.

The first enhancement stage 110 generates enhancement 1 parameters 114 which are stored or transferred to the receiver. A decoding 115 results again in a decoded enhanced signal 116. The signal 116 is supplied together with the transformed, synthesized audio signal 106 to an inverse difference generator 117. In turn, the signal 118 resulting from the inverse difference generation 117 is supplied, together with the transformed input signal 107, to a combination 119 at the input of a second enhancement stage 120. Enhancement stages 110, 120 are added until the bit rate available on the transfer channel is fully exhausted. The allocation control 140 controls the coding stages 113, 121 of the enhancement stages 110, 120.

In the present embodiment example, a frequency transform, in particular a MDCT, is implemented as the transform 105. This transform runs synchronous to the subframes of the core codec 100 which is a core codec of the ITU T G.723.1 type. This type of core codec uses a frame length of 30 milliseconds which is subdivided into four subframes, each lasting 7.5 milliseconds.

Figure 2:
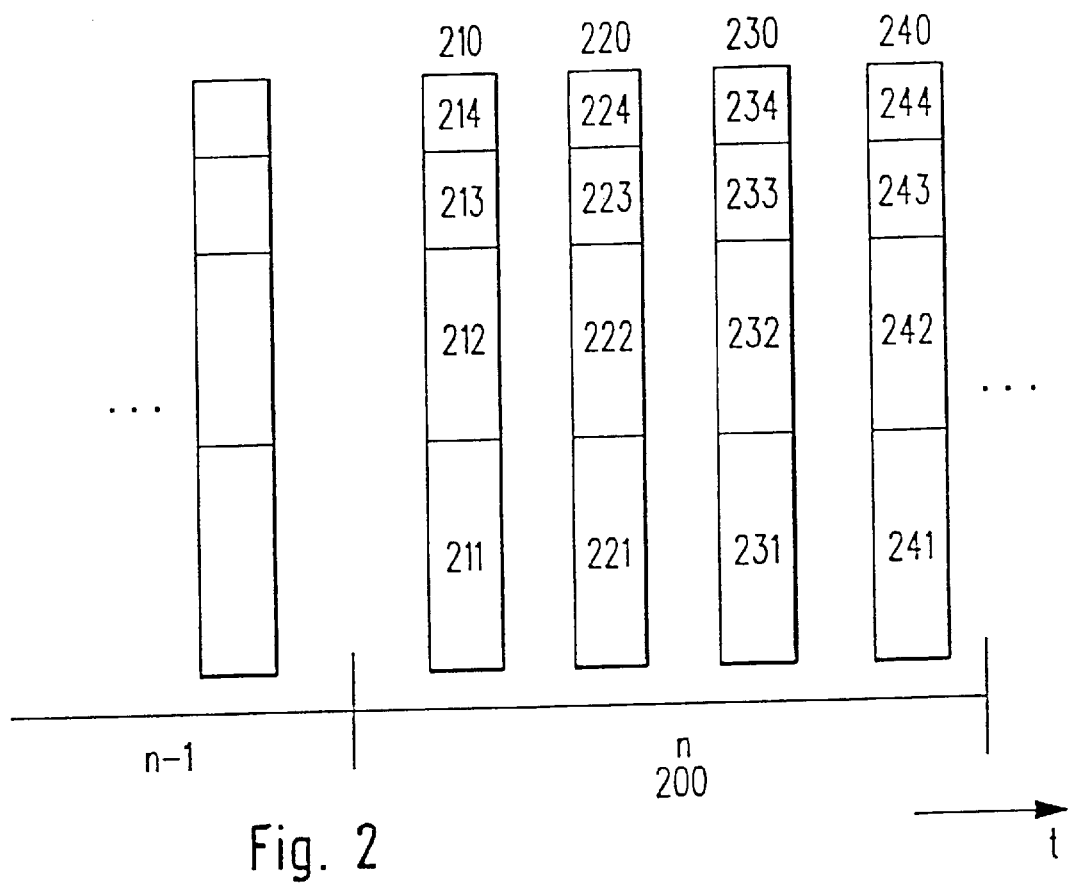
FIG. 2 shows the subdivision of a frame of the core codec into four subframes.

FIG. 2 shows a subdivision of a frame into four subframes, wherein a vector with spectral values divided into bands according to subjective criteria, e.g., by grouping according to the BARKSCALE, is generated for each frame. FIG. 2 shows part of a preceding frame n−1 along the horizontal time axis as well as a complete frame n 200. Four transforms are carried out for every frame and four vectors 210, 220, 230, 240 are generated in a corresponding manner. In the time domain, a subframe with a duration of 7.5 milliseconds corresponds to each spectrum vector. Each spectrum vector is subdivided into four partial bands. Correspondingly, spectrum vector 210 has four partial bands 211 to 214, spectrum vector 220 has four partial bands 221 to 224, spectrum vector 230 has four partial bands 231 to 234, and spectrum vector 240 has four partial bands 241 to 244. Therefore, there exists a total of sixteen partial bands per frame 200. One of these sixteen partial bands is now enhanced in each enhancement stage of the coding algorithm. In this connection, the allocation control 140 determines and decides which partial band is to be enhanced. This determination can be effected on the basis of a psycho-acoustic model which ascertains which of the frequency bands are important subjectively, or by means of measurements of signal-to-noise ratios. The enhancement stage generates a set of parameters which is stored. In addition to these parameters, the address of the band which has been enhanced is stored. The enhanced partial band is now taken into consideration during further coding and the enhancement process is repeated. Accordingly, it can now be assumed that the bits of an nth enhancement stage are more important subjectively than the bits of an (n+1)th stage. It is also possible for a plurality of enhancement stages to enhance the same partial band.

Figure 3:
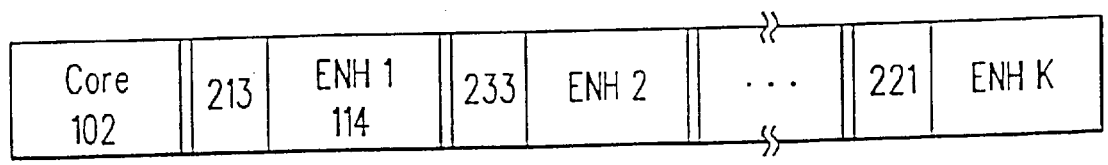
FIG. 3 shows a storage and transfer format which corresponds to the subjective priorities.

FIG. 3 shows the stored or transferred bit sequence. The bit sequence starts with the core parameters 102 determined from the core codec 100. An address 213 of the enhanced partial band is followed by the parameters of the first enhancement stage ENH 1 114. This is followed by the address 232 of the second enhanced partial band and the associated enhancement parameters ENH 2. The address 222 of the last enhanced partial band and the associated enhancement parameters ENHK form the end of the bit stream. By arranging the bits in the bit stream in order of core, first enhancement stage, second enhancement stage, and so forth, up to the last enhancement stage, the bits are automatically ordered according to their subjective importance. Since every stage has been provided with an address 213, 232, 221, the correct attribution can be carried out in the receiver. It is now possible to scale to the available bit rate without problems and in an economical manner by suppressing the enhancement stages, starting with the last, least significant stage ENH K. This scaling can be effected at any point along the transfer line.

Individual partial bands do not absolutely have to be coded; rather, they can be calculated or approximated by prediction or interpolation from neighboring bands. This makes it possible not to transfer some partial bands or to transfer them only by means of a few interpolation parameters and to generate them in the receiver from the neighboring bands. In the present example, it is possible to interpolate the partial bands 212 and 232 from the neighboring partial bands. In this case, the interpolation can be effected from partial bands neighboring in time as well as from partial bands neighboring in the spectral frequency range. The described processes can also be applied when the transform is carried out less than four times per frame, for example, only once. Advantageous realizations always result when the enhancement part uses the same quantity of subframes as the core codec.

Figure 4A:
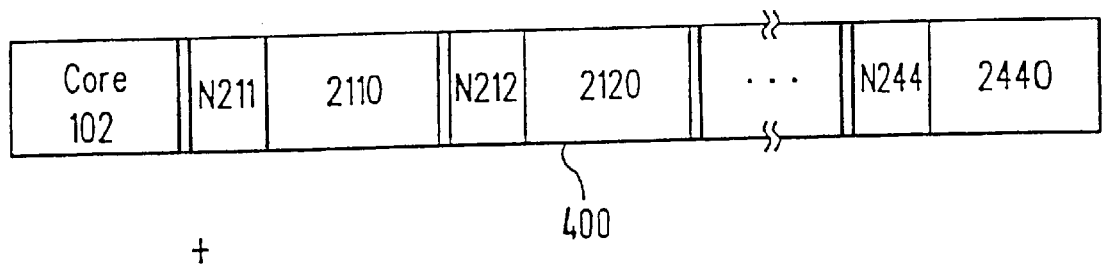
FIG. 4a shows an alternative storage and transfer format which has less addressing overhead.
Figure 4A:
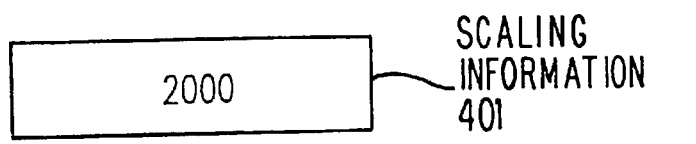

FIG. 4a shows an alternative storage and transfer format which has less addressing overhead. A storage format of this kind is particularly suitable for data base accesses. The quantity of enhancement stages N 211, N 212, N 244 present in the bit stream for each of the partial bands 211, 212, 244 is stored for each partial band 211, 212, 244, and all enhancement bits 2110, 2120, 2440 are subsequently stored one after the other. The organization of the bit stream in accordance with subjective importance is lost in this way. However, in order to be able to suppress the subjectively least significant bits initially during scaling, additional scaling information 2000 containing this information about subjective importance is stored for each audio data frame.

Figure 4B:
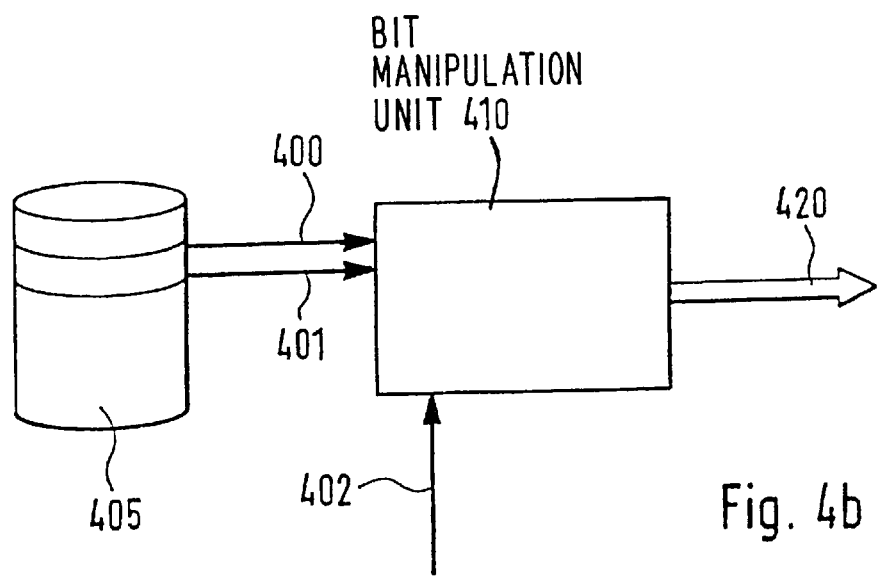

FIG. 4b shows a bit manipulation unit corresponding to the alternative storage and transfer format of FIG. 4a. The bit manipulation unit 410 receives the scaling information 401 as well as the audio data stream 400 from an audio data base 405. Corresponding to a predetermined bit rate 402, the bit manipulation unit 410 continues suppressing enhancement stages until the available bit rate has been achieved. The additional information in the bit stream, in particular the quantity of the enhancement stages per partial band, must of course be corrected after a stage has been removed. The resulting data stream 420 is subsequently transferred.

Two essential fields of application for bit rate scaling are described in the following.

When accessing an audio data base in which an audio source is coded and stored at a maximal bit rate of, for example, 64 kbit per second, accessing can be effected with different transfer systems which have different bit rates. Before sending, the bit rate therefore needs to be adapted to the available bit rate of the transfer system by suppressing suitable bits or by code conversion. In the receiver, an optimal quality for the scaled bit rate is ensured in this way.

A further example is the transfer in transfer systems with a variable bit rate, for example, by means of an ATM (Asynchronous Transfer Modus) mode, as it is called, or on the Internet, for example. For an application of this type, the bit rate can be adapted locally to ensure a continuous transfer by suppressing suitable bits in a switching node when this switching node can no longer process the audio data stream unchanged because of overloading or other influences.

What is claimed is:

1. A process for generating a bit rate scalable audio data stream having the following steps: compression of the audio data stream in a core codec accompanied by the determination of core parameters; and enhancement of the coding in at least one downstream enhancement stage, wherein the enhancement in the enhancement stage is controlled by the core parameters, wherein the audio data stream is frequency-transformed, wherein a synthesized audio signal produced by the core codec is likewise frequency-transformed, and wherein the frequency-transformed synthesized audio signal is combined with the frequency-transformed audio data stream.

2. Device for carrying out the process according to claim 1 characterized by a core codec which compresses the audio data stream while also determining core parameters, at least one enhancement stage downstream of the core codec, wherein the core codec is connected with the enhancement stage, an operative connection between the core codec and enhancement stage in order to control the enhancement stage by means of the core parameters, a frequency transformation stage for the audio data stream, another frequency transformation stage for the synthesized audio signal provided by the core codec, a combination stage for the signals subjected to the frequency transformation.

3. Device according to claim 2, characterized in that the device has an allocation control which controls which partial band is enhanced.

4. Process according to claim 1, characterized in that a vector coding is effected in the enhancement stage (102).

5. Process according to claim 1, characterized in that the core parameters (102) control the selection of code books.

6. Process according to claim 1, characterized by the transfer of the combination parameters to the receiver.

7. Process according to claim 1, characterized in that the core codec (100) divides the input signal (130) into at least two subframes, and in that the transformation (105) is a frequency transformation which runs synchronous to the subframe of the core codec (100).

8. Process according to claim 7, characterized in that, by means of the frequency transformation (105), a transformation is effected per subframe which each time generates a spectrum vector (210, 220, 230, 240), in that each spectrum vector (210) is divided into at least two partial bands (211 to 214), and in that each enhancement stage (110, 120) enhances one of these partial bands (211 to 214).

9. Process according to claim 8, characterized in that, for each enhancement stage (110), a set of parameters (ENH1) and an address (213) for the enhanced partial band are transferred.

10. Process according to claim 8, characterized by storing for every partial band as many enhancement stages, arranged one behind the other in a bit stream to be transferred, as are present for the respective partial band (N211); storing additional information (2000) for the determination of the relative significance of the individual enhancement stages of the partial bands; and bringing together the bit stream (400) and the additional information (401) before transfer in a bit stream manipulation unit (410).

11. Process according to claim 8, characterized by the generation of partial bands on the receiver side by calculation from neighboring partial bands that have been received, in particular by interpolation.

* * * * *